(12) United States Patent
Yong

(10) Patent No.: US 8,581,651 B2
(45) Date of Patent: *Nov. 12, 2013

(54) DUTY CYCLE BASED PHASE INTERPOLATORS AND METHODS FOR USE

(75) Inventor: Gideon Yong, Minneapolis, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/608,690

(22) Filed: Sep. 10, 2012

(65) Prior Publication Data

US 2012/0326750 A1 Dec. 27, 2012

Related U.S. Application Data

(63) Continuation of application No. 12/854,771, filed on Aug. 11, 2010, now Pat. No. 8,278,987.

(51) Int. Cl.
*H03K 3/017* (2006.01)

(52) U.S. Cl.
USPC .............................. 327/175; 327/35; 327/231

(58) Field of Classification Search
USPC .............. 327/31, 35, 36, 165–166, 172–172, 327/231, 233–236
See application file for complete search history.

(56) References Cited

U.S. PATENT DOCUMENTS

| 7,205,799 B2 | 4/2007 | Kim et al. |
| 7,852,155 B2 | 12/2010 | Chaoui |
| 2005/0242858 A1 | 11/2005 | Figoli et al. |
| 2006/0066364 A1 | 3/2006 | Kim et al. |
| 2011/0291584 A1 | 12/2011 | Filippo et al. |
| 2012/0038404 A1 | 2/2012 | Yong |

*Primary Examiner* — An Luu
(74) *Attorney, Agent, or Firm* — Dorsey & Whitney LLP

(57) ABSTRACT

Duty cycle based phase interpolators, and methods for implementing duty cycle based phase interpolators are disclosed. One such phase interpolator includes a first pulse width modulator configured to generate a first duty cycle signal, and a second pulse width modulator configured to generate a second duty cycle signal. The phase interpolator further includes a logic unit configured to merge the first duty cycle signal and the second duty cycle signal to produce a periodic digital signal with a controllable phase depending on the first and second duty cycle signals.

26 Claims, 6 Drawing Sheets

DUTY CYCLE BASED PHASE INTERPOLATORS AND METHODS FOR USE

CROSS REFERENCE TO RELATED APPLICATION(S)

This application is a continuation of U.S. patent application Ser. No. 12/854,771, filed Aug. 11, 2010, issued as U.S. Pat. No. 8,278,987, on Oct. 2, 2012. This application and patent are incorporated herein by reference, in their entirety, for any purpose.

TECHNICAL FIELD

Embodiments of the present invention relate generally to periodic digital signals, and more specifically, in one or more illustrated embodiments, to interpolating the duty cycles of multiple pulse width modulation circuits to obtain an arbitrary signal phase shift.

BACKGROUND OF THE INVENTION

Periodic digital signals are commonly used in a variety of electronic devices, such as dynamic random access memory ("DRAM") and flash memory. These periodic digital signals are frequently produced as clocks within these devices, and are typically used to establish the timing of a digital signal, or the timing at which an operation is performed. Periodic digital signals may also be used as in a constant strobe signal. Data signals may be transmitted to or received from electronic devices in synchronism with a periodic digital signal. Precise alignment of the clock and data signals is of importance in order to permit accurate data transmission.

As the speed of memory and other electronic devices continues to increase, the "eye" (or period in which a digital signal is valid), becomes smaller. This requires higher clock precision in order to properly align the phases of a data eye with the clock, and increases the importance of the timing of the clock or strobe. The alignment of the data eye is critical in data recovery circuits in order to synchronize the internal or external clock with respect to the incoming data. The data in the channel can be delayed for a variety of reasons such as process variation, temperature, local voltage and mismatched physical trace lengths. Additionally, the growing trend to include several computing devices on the same board present another challenge with respect to synchronizing a clock with all components within a system. As a result, there may be a need to adjust the phase of a clock signal to synchronize it with any synchronous digital signal or synchronous system components.

In the past, this type of clock adjustment has been performed with mixer-based analog interpolators, which work by mixing two quadrature signals together with an analog mixer. With the use of digitally controlled current mirrors, the strength of each input can be adjusted to produce any arbitrary phase at the output. However, analog mixers have significant power and area costs. Additionally, analog mixers inherently produce a significant amount of integral non-linearity, which occurs when phase relationships do not change in a linear fashion. This non-linearity is often adjusted and accounted for through costly signal pre- and post-processing, however these methods are complicated and consume extra power and space.

BRIEF DESCRIPTION OF THE DRAWINGS

While the specification concludes with claims particularly pointing out and distinctly claiming the subject matter that is regarded as forming the various embodiments of the present disclosure, it is believed that the embodiments will be better understood from the following description taken in conjunction with the accompanying Figures, in which:

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
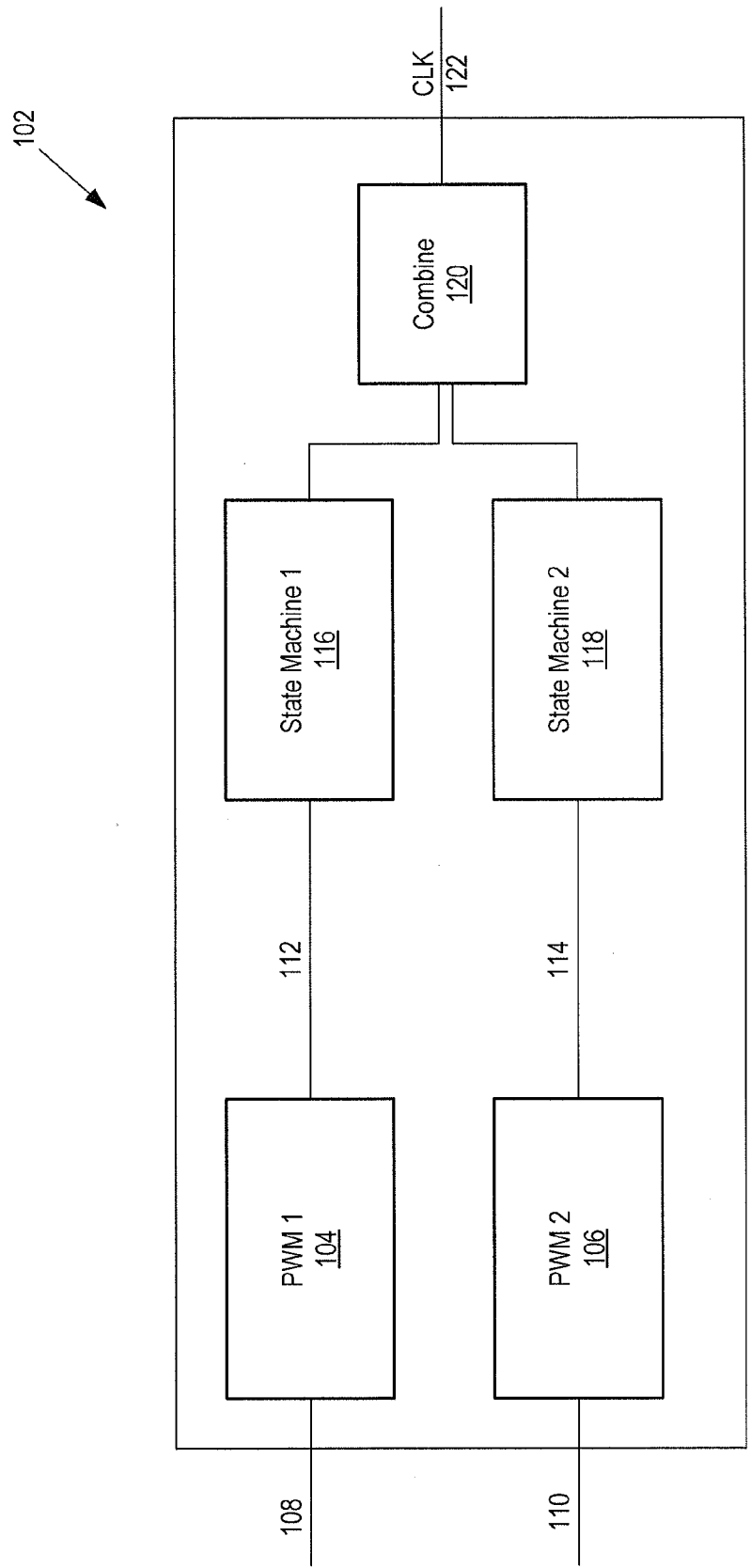
FIG. 1 is a block diagram of a duty cycle-based phase interpolator circuit according to an embodiment of the invention.

FIG. 1 illustrates a block diagram of a duty cycle-based phase interpolator circuit 102 according to an embodiment of the invention. The interpolator circuit 102 may include a first pulse width modulator 104 and a second pulse width modulator 106, which each accept a current input 108 or 110, respectively. Pulse width modulators 104 and 106 output variable duty cycle signals 112 and 114 (interchangeably referred to as "duty cycles" or "signals") having opposing duty cycles. Variable duty cycle signal 112 may then be directed into state machine 116, while variable duty cycle signal 114 is directed into state machine 118. State machines 116 and 118 perform a divide-by-two operation on their respective incoming duty cycle signals 112 and 114 before routing each signal to combinational logic circuit 120. Combinational logic circuit 120 then merges variable duty cycle signals 112 and 114, for example by combining the rising edge of signal 112 and the rising edge of signal 114, to produce a clock 122.

In operation, the output signals of pulse width modulators 104 and 106 can be adjusted by changing the current input to each. By simultaneously varying the voltage inputs 108 or 110 to pulse width modulators 104 and 106, the overall duty cycle of both signals 112 and 114 can be changed. The duty cycles 112 and 114 may then be individually halved, and then combined in order to shift the phase of clock 122. In certain embodiments, it is then possible to align clock 122 with any synchronous activity, such as with the center of a data eye.

With control over the phase of clock 122, it is likewise also possible to facilitate synchronization of multiple elements within an electronic system.

Figure 2:
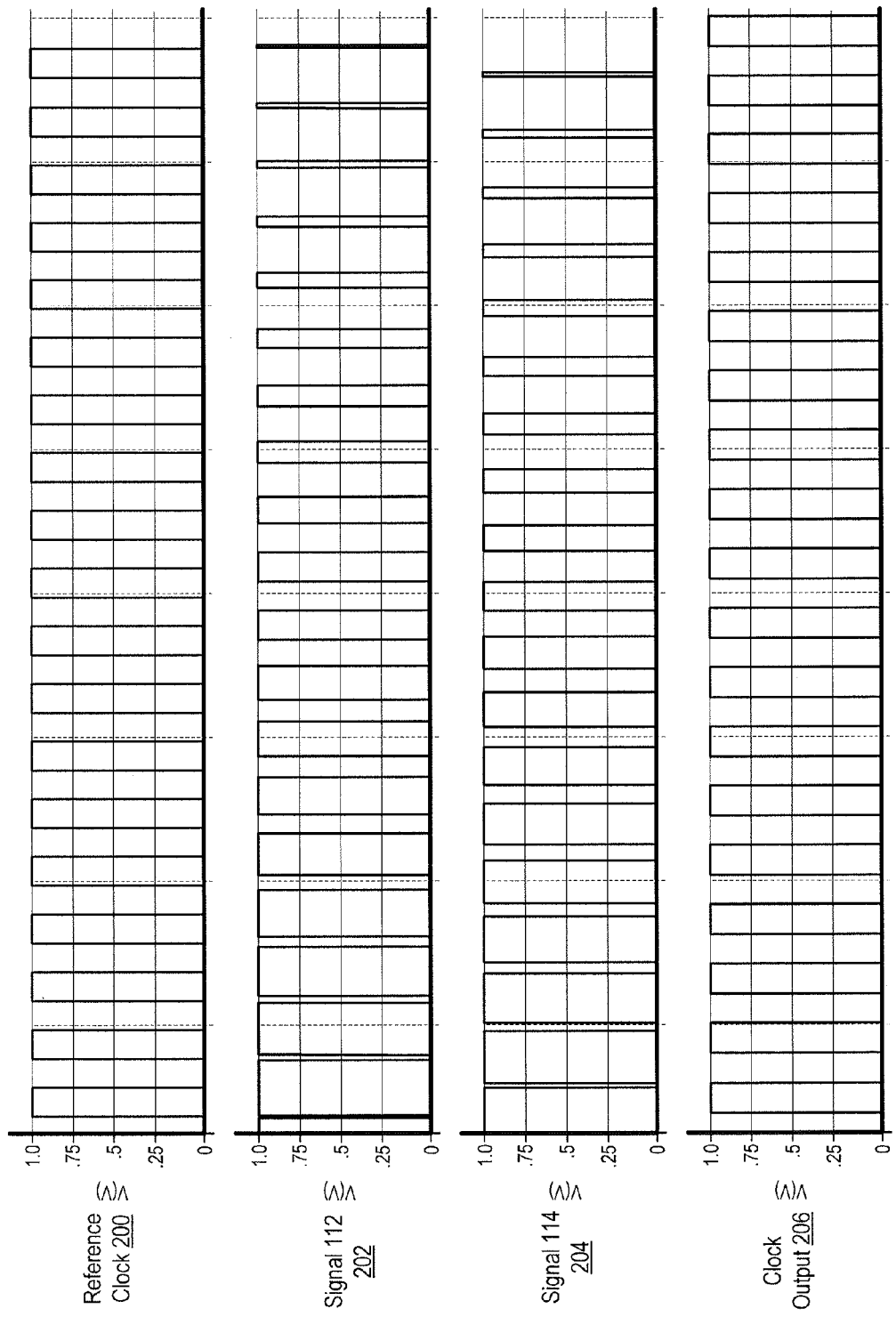
FIG. 2 is a transient response wave diagram of certain components of a phase interpolator output according to an embodiment of the invention.

FIG. 2 illustrates example transient response wave diagrams of the operation of certain components of a phase interpolator circuit 102, according to an embodiment of the invention illustrated in FIG. 1. For orientation of the wave diagrams, reference clock wave 200 is provided, which depicts a wave with a constant phase. Below it is the transient response wave diagram 202 for the variable duty cycle signal 112 of FIG. 1. Wave diagram 204 also demonstrates the activity of variable duty cycle signal 114 from FIG. 1. Output wave diagram 206 illustrates the activity of the output of clock 122 of FIG. 1. According to the illustrated embodiment, as the duty cycles 112 and 114 change in size, the phase of clock 122 in output wave 206 is shifted forwards and backwards with respect to the reference clock wave 200. In the example of FIG. 2, the duty cycles of 112 and 114 are decreasing, thus shifting output wave 206 out of phase with respect to the reference clock at the left end of the wave graph, and as time progresses, back into phase at the right end of the wave graph. As the duty cycles of signals 112 and 114 decrease, the phase of output wave 206 continues to shift. In some embodiments, because the duty cycles of signals 112 and 114 are controllable at will through input voltage, the phase of output wave 206 is also shiftable at will. For example, this may be done to correctly align the clock with a data eye. Once the clock 122 is shifted to its desired phase position relative to synchronized data, the duty cycles of signals 112 and 114 may then be held constant for transmission and receiving.

Figure 3A:
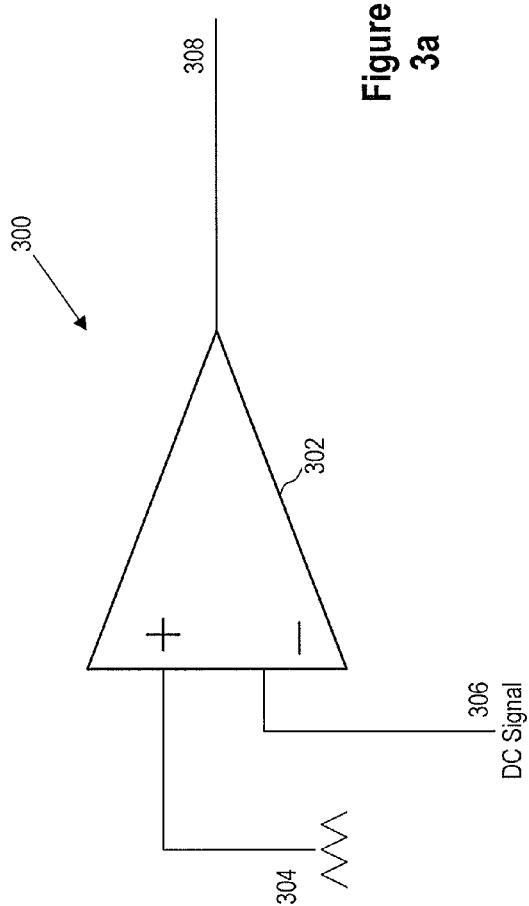
FIG. 3A is a schematic diagram of a triangle wave pulse width modulator usable in a phase interpolator according to an embodiment of the invention.
Figure 3B:
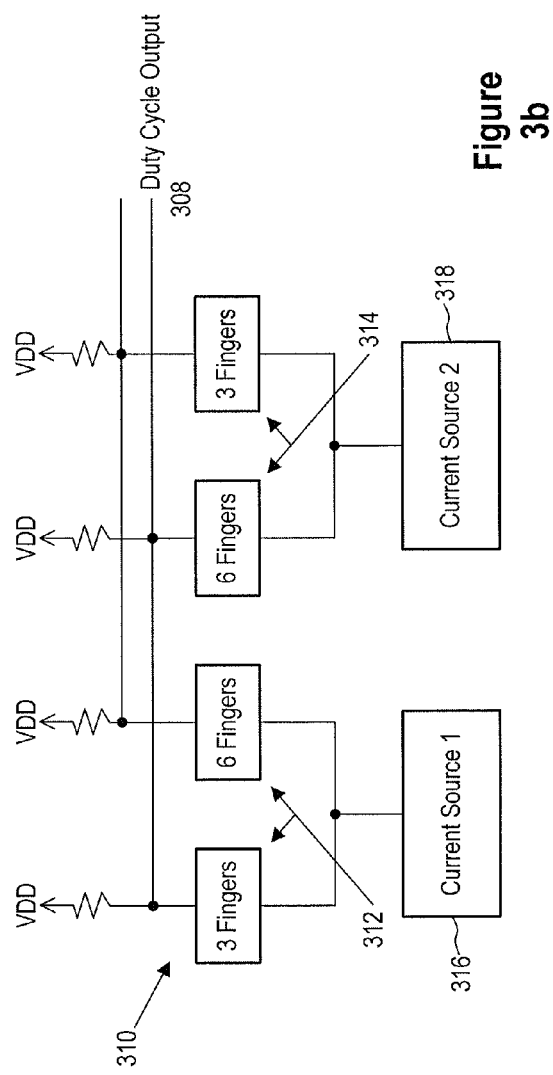
FIG. 3B is a schematic diagram of a differential amplifier pulse width modulator usable in a phase interpolator according to an embodiment of the invention.

The pulse width modulation portion of the phase interpolator circuit may be implemented in any suitable manner. FIGS. 3A and 3B show examples of pulse width modulation circuits which may be used as the pulse width modulators 104 and 106 to produce variable duty cycle signals 112 and 114. Control of both duty cycles for signals 112 and 114 permits the phase interpolator circuit 102 to produce whatever phase shift may be desired.

FIG. 3A illustrates a comparator-type pulse width modulator 300, implemented with an operational amplifier 302. Comparator 300 may be fed by triangle wave 304 alongside a direct current ("DC") signal 306. The DC signal 306 truncates the triangle wave 304 at the value of the DC signal 306 applied. The DC signal 306 may then be increased or decreased to produce a duty cycle modulated version of the triangular wave 304. Accordingly, any duty cycle output 308 may be produced by varying DC signal 306. However, in certain embodiments high speed triangular waves are not available, and so another possible implementation for pulse width modulators 104 and 106 is provided below.

FIG. 3B illustrates an embodiment of a pulse width modulator using a differential amplifier with a DC tunable offset 310. According to one embodiment, the differential amplifier 310 comprises two parts. The first part includes two sets of purposely mismatched differential pairs 312 and 314, which are used to drive the same variable duty cycle output 308. Each set of differential pairs 312 and 314 may be coupled to and controlled by current sources 316 and 318, which make up the second part of the differential amplifier 310. Current source 316 supplies current for mismatched pair 312, while current source 318 supplies current to mismatched pair 314. Each current source may include cascoded switchable binary weighted current sources.

In the embodiment shown in FIG. 3B, switchable binary weighted current sources 316 and 318 may increase or decrease their respective current outputs to their respective mismatched transistor pairs 312 and 314. By adjusting the current to the mismatched pairs, the DC offset of differential amplifier 310 is tuned up and down to set the desired duty cycle output 308. In the illustrated embodiment, each mismatched differential pair has transistors with 3 and 6 fingers each, for a total of 9 fingers for each mismatched pair 312 and 314. However, several different mismatched finger arrangements may be used. For example, two sets of mismatched pairs 312 and 314 with transistors of 5 and 10 fingers function similarly to the above. This arrangement permits a controllable duty cycle output 308 from pulse width modulators 104 and 106.

Figure 4:
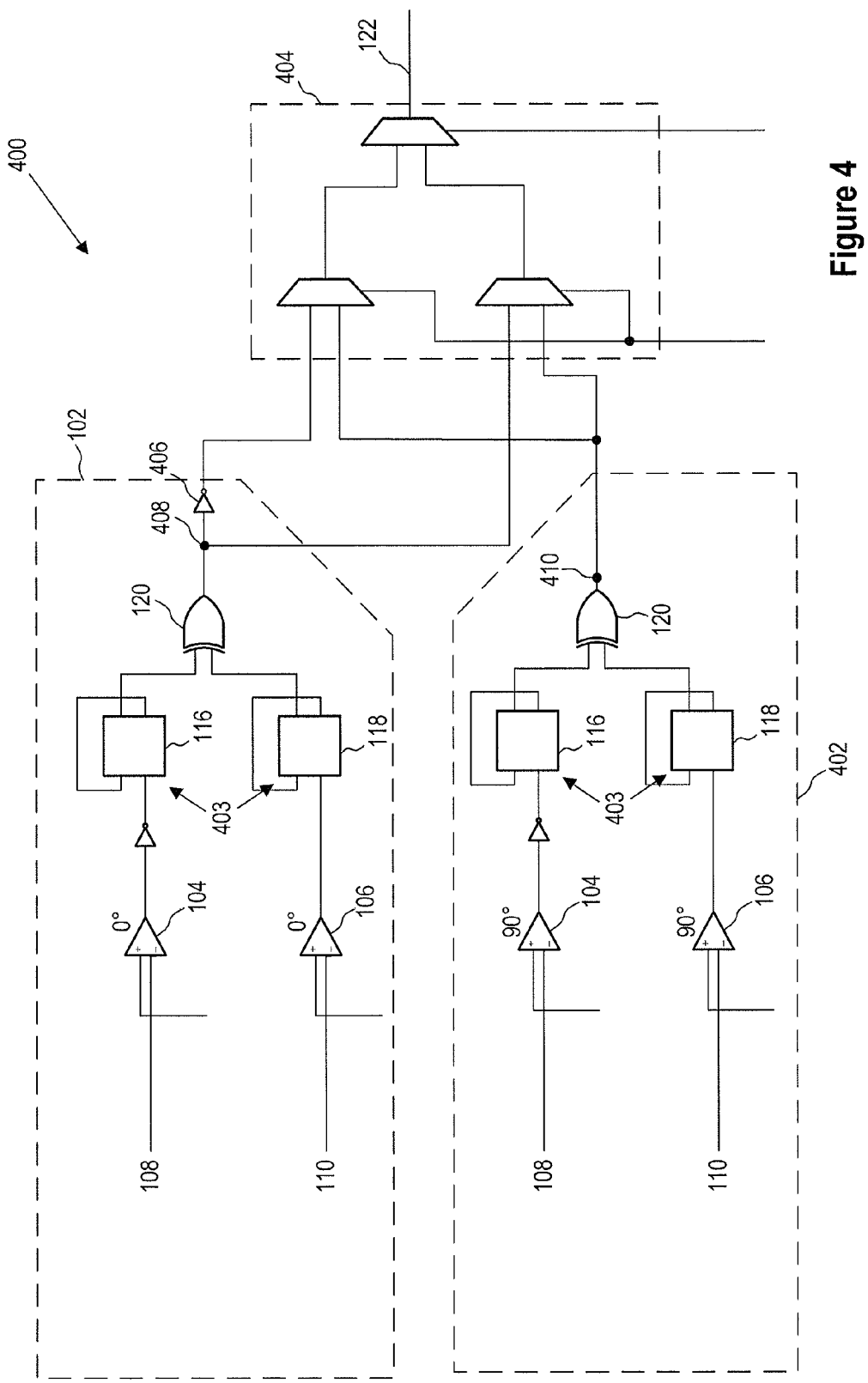
FIG. 4 is a schematic diagram of a phase-shifted interpolator according to an embodiment of the invention.

In some embodiments, particularly involving higher frequency waves, it may be impractical to produce the very small duty cycle signals 112 and 114 sometimes necessary to obtain the desired clock phase shift. If a certain duty cycle cannot be produced, then the phase shift corresponding to those duty cycle values would not be possible. To account for this, FIG. 4 illustrates a schematic diagram of a phase-shifted interpolator circuit 400 according to another embodiment of the invention. Phase-shifted interpolator circuit 400 may include phase interpolator 102, 90-degree shifted interpolator 402, and multiplexer 404. As shown in FIG. 1, phase interpolator 102 and 90-degree shifted interpolator 402 may each include two pulse width modulators 104 and 106 which are coupled to state machines 116 and 118, respectively. The wave output by 90-degree shifted interpolator 402 is shifted 90 degrees with respect to the pulse width modulators of phase interpolator 102, and is described in more detail below. The pulse width modulators 104 and 106 in the current embodiment are comparator type modulators, as shown in FIG. 3A. However, in other embodiments, pulse width modulators 104 and 106 may instead be differential amplifiers.

In the embodiment shown, state machines 116 and 118 are each implemented with a D flip-flop 403 to perform the divide-by-two operation. Each phase-shifted interpolator may further include combinational logic unit 120 to merge variable duty cycle signals 112 and 114. As shown, combinational logic unit 120 is implemented with an XOR logic gate to combine signals 112 and 114. The phase interpolator 102 may be coupled to inverter 406 and output clock signal 408, while 90-degree shifted clock may be coupled to signal 410. Clock signals 408 and 410 may then be routed to multiplexer 404, which outputs clock 122.

In operation, phase-shifted interpolator circuit 400 creates clock output 122 with a phase that may be shifted a full 360 degrees, but without using very small or very large duty cycles to do so. In order to avoid using undesired portions of a duty cycle to produce the desired phase shift, circuit 400 uses phase interpolator 102 and shifted interpolator 402 to produce two clocks with phases separated by 90 degrees. According to the present embodiment, interpolator 102 produces clock signal 408, and shifted interpolator 402 produces 90-degree shifted clock 410. Multiplexer 404 then switches back and forth between signals 408 and 410 depending on the desired magnitude of the duty cycle necessary to produce the needed phase shift in output clock 122. For example, in the current embodiment, the multiplexer 404 switches between one interpolator output to the other if the duty cycle of signals 408 or 410 fall outside of the range of 25% to 75%. In the present embodiment, multiplexer 404 is a 4:1 multiplexer implemented by three 2:1 multiplexers, however other implementations are also possible.

In the embodiment illustrated in FIG. 4, the 360 degree range of possible phase shifts are divided into four quadrants: 0-90 degrees, 90-180 degrees, 180-270 degrees, and 270-360 degrees. In the shown circuit, interpolator 102 handles the 0-90 degree shifts and 180-270 degree shifts, while shifted interpolator 402 handles the 90-180 degree shifts and the 270-360 degree shifts. Inverters 406 permit interpolators 102 and 402 to cover two shift ranges each by inverting their respective outputs if necessary. The shift quadrants may be divided up in this fashion so that the duty cycles of the pulse width modulators 104 and 106 within interpolators 102 and 402 do not fall outside the 25%-75% range for their respective shift quadrants. The multiplexer may then automatically select the output of the correct interpolator signal (either 408 or 410) depending on the degree of the phase shift desired, which may then be output as clock output 122. In other embodiments, the multiplexer may be configured to shift in response to other duty cycle and phase shift range requirements.

Figure 5:
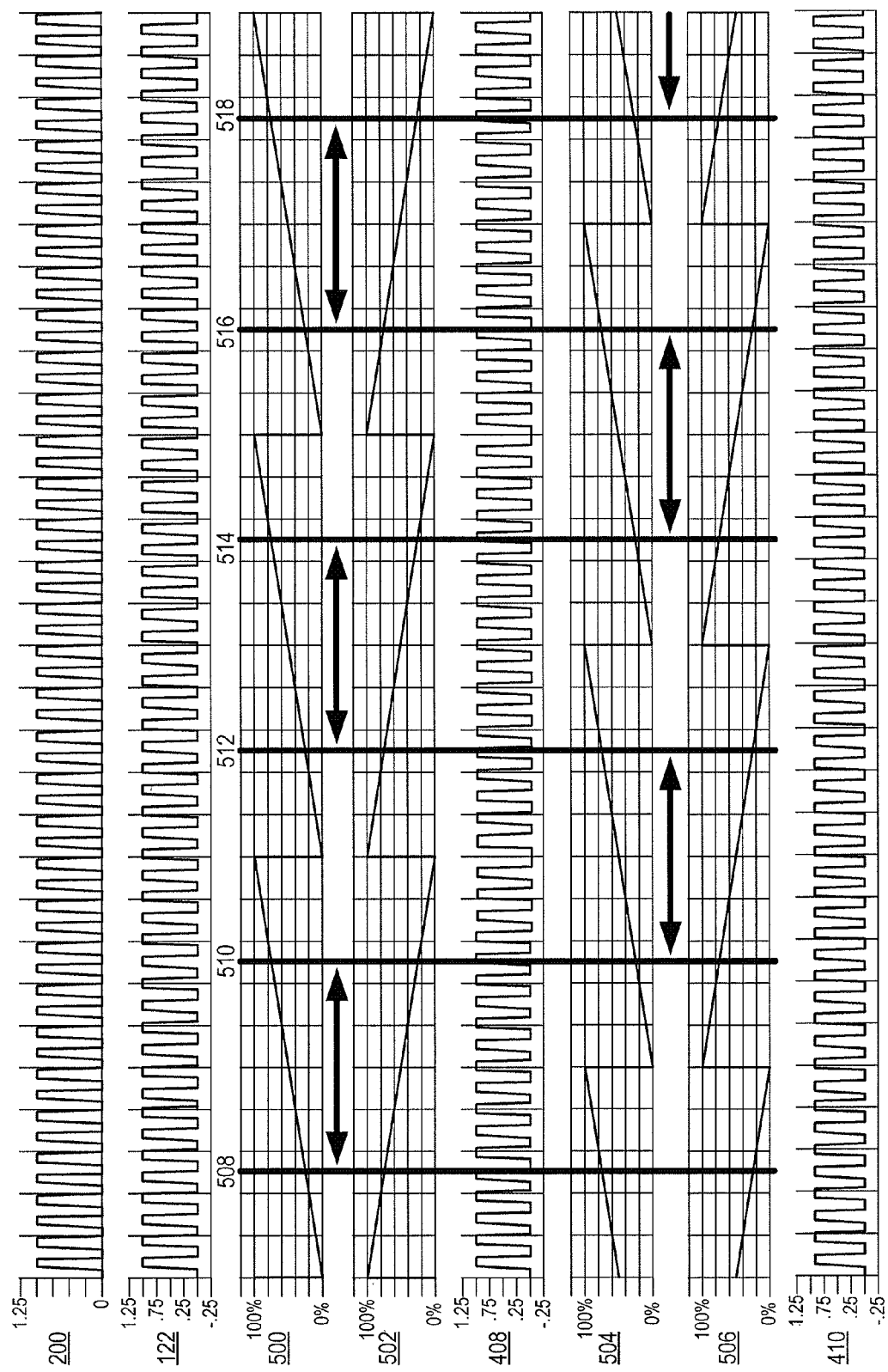
FIG. 5 is a transient response wave diagram of a phase-shifted interpolator according to an embodiment of the invention.

The activity of the phase-shifted interpolator circuit 400 of FIG. 4 is further illustrated in FIG. 5, which is a transient response wave diagram of the phase-shifted interpolator according to an embodiment of the invention. For reference purposes, a reference clock 200 with a constant phase is provided. Below it is an example of the wave diagram for output clock 122. The phase shift which is produced by phase-shifted interpolator circuit 400 can be observed by examining clock output 122 with respect to reference clock 200. Wave diagrams 500 and 502 are the analog data codes fed into a digital-to-analog converter. The analog voltage corresponds to the duty cycle at the output of pulse width modulation circuits 104 and 106 of non-shifted phase interpolator 102. Each wave ranges from a 0% to a 100% duty cycle along the Y-axis. In contrast, wave diagrams 504 and 506 below correspond to the pulse width modulators 104 and 106 within 90-degree shifted interpolator 402. A 90 degree phase separation is observable between the two sets of pulse width modulators. Furthermore, sample output clock signals 408 and 410 from interpolator 102 and shifted interpolator 402 are also depicted.

In order to express exemplary activity of circuit 400, vertical lines 508-518 demonstrate possible multiplexer 404 switchover locations. These switchovers occur when the duty cycle range of pulse width modulators for the phase interpolator circuit 102 and shifted phase interpolator 402 are not within the desired range. The 25%-75% duty cycle range is arbitrary, and is used for demonstrative purposes. Other ranges and switchover locations for multiplexer 404 are possible.

The area between vertical lines 508 and 510 indicates sample duty cycles of pulse width modulators 104 and 106 between 25% and 75%. As waveform 502 decreases below approximately 25% duty cycle and waveform 500 increases beyond approximately 75% duty cycle, the multiplexer switches the output of clock 122 from phase interpolator 102 to phase-shifted interpolator 402, which has pulse width modulator duty cycles that are just returning into the range between 25% and 75% (as shown in wave diagrams 504 and 506). When the duty cycles of interpolator 402 exit the desired range, multiplexer 404 switches clock output 122 back to interpolator 102, and so on. Whenever phase interpolator 102 or phase-shifted interpolator 402 exits the desired duty cycle range, it is no longer used to output clock 122. In this way, whatever the phase shift desired for output clock 122, the phase-shifted interpolator 400 can maintain a 25%-75% duty cycle for its pulse width modulators 104 and 106.

Figure 6:
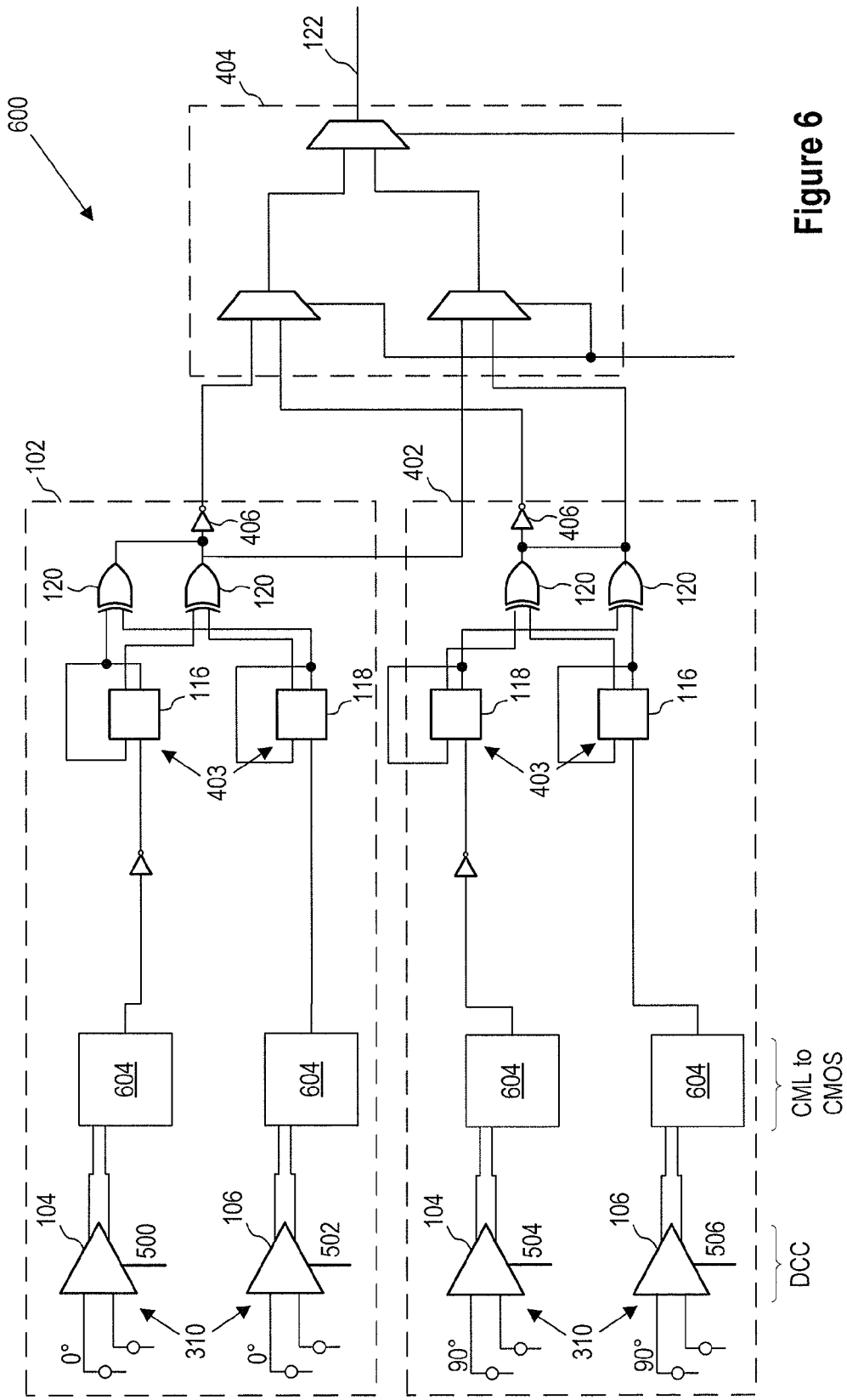
FIG. 6 is a schematic diagram of a practical implementation of a duty cycle-based phase-shifted interpolator according to an embodiment of the invention.

FIG. 6 is a schematic diagram of another embodiment of the duty cycle-based phase-shifted interpolator circuit 400. Similar to the circuit in FIG. 4, phase-shifted interpolator circuit 600 uses phase interpolator 102 and 90-degree phase-shifted interpolator 402 to produce two clocks separated by 90 degrees. The interpolators may each include pulse width modulators 104 and 106, although the implementation in circuit 600 uses differential amplifiers 310, rather than comparator 300 type modulators as in circuit 400. The duty cycle regulation in phase-shifted interpolator circuit 600 may be controlled with a digital signal. According to some embodiments, digital-to-analog converters can adjust digital signal strength to make the resulting duty cycle bigger and smaller. Also in some embodiments, the output of differential amplifiers 310 may range from Vdd to ½ Vdd, and so circuit 600 may also include a CML-to-CMOS converters 604 to convert the voltage to full. According to the present embodiment, the remaining circuitry of circuit 600 is substantially identical to the phase-shifted interpolator circuit 400, as each pulse width modulator 104 or 106 may be coupled to a state machine 116 implemented with a D flip flop 403, combinational logic 120 implemented with an XOR gate, invertors 406, and a 4:1 multiplexer 404. Upon outputting clock 122 from the circuit 600, clock 122 may then be compared to and aligned with the desired activity, such as a synchronized data stream.

As illustrated by the previous examples, embodiments of circuits 400 and 600 may improve over conventional mixer based analog interpolators and other conventional circuits due to avoiding the necessity of pre- and post-processing of the clock signal 122. The increased accuracy of the phase shifting process of the invention over conventional circuits renders extra processing unnecessary. Extra processing circuitry also adds significant power consumption overhead and increased circuit size, which may be avoided according to the present invention. Moreover, some embodiments of the duty cycle-based phase-shifted interpolator circuit of the present invention may inherently produce less integral non-linearity than conventional circuits. Integral non-linearity error may be further reduced with the use of specially weighted digital-to-analog converters that place a larger emphasis on certain codes. By assigning higher weights to certain codes, specially weighted converters can adjust the output signal for errors that maximize non-linearity. These specially weighted digital-to-analog converters are very easy to implement and consume virtually no additional power. As shown in FIG. 6, the differential amplifier 310 uses a CML type clock, which typically has a slope that is very close to linear. Assuming there is a constant slew rate (i.e. a perfectly linear rise and fall time) it is possible to achieve zero integral non-linearity when using the differential amplifier 310 to control duty cycle.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
a first interpolator configured to provide a first duty cycle signal and a second duty cycle signal;
a second interpolator configured to provide a first phase-shifted duty cycle signal and a second phase-shifted duty cycle signal;
a first logic unit configured to receive the first duty cycle signal and the second duty cycle signal, the first logic unit further configured to output a first periodic signal;
a second logic unit configured to receive the first phase-shifted duty cycle signal and the second phase-shifted duty cycle signal, the second logic unit further configured to output a second periodic signal; and a multiplexer coupled to the first logic unit and the second logic unit, the multiplexer configured to selectively provide the first periodic signal and the second periodic signal.

2. The apparatus of claim 1, wherein the first interpolator comprises:
a first pulse width modulator configured to generate a first raw duty cycle signal, the first duty cycle signal based, at least in part, on the first raw duty cycle signal; and
a second pulse width modulator configured to generate a second raw duty cycle signal, the second duty cycle signal based, at least in part, on the second raw duty cycle signal.

3. The apparatus of claim 2, wherein the first interpolator comprises:
a first state machine coupled to the first pulse width modulator and the first logic unit, the first state machine configured divide the first raw duty cycle signal to produce the first duty cycle signal; and
a second state machine coupled to the second pulse width modulator and to the second logic unit, the second state machine configured divide the second raw duty cycle signal to produce the second duty cycle signal.

4. The apparatus of claim 3, wherein the second interpolator comprises:
a third pulse width modulator configured to generate a first raw phase-shifted duty cycle signal, the first phase-shifted duty cycle signal based, at least in part, on the first raw phase-shifted duty cycle signal; and
a fourth pulse width modulator configured to generate a second raw phase-shifted duty cycle signal, the second duty cycle signal based, at least in part, on the second raw phase-shifted duty cycle signal;
a third state machine coupled to the third pulse width modulator and to the second logic unit, the third state machine configured divide the first raw phase-shifted duty cycle signal to produce the first phase-shifted duty cycle signal; and
a fourth state machine coupled to the fourth pulse width modulator and to the second logic unit, the fourth state machine configured divide the second raw phase-shifted duty cycle signal to produce the second phase-shifted duty cycle signal.

5. The apparatus of claim 2, wherein the first pulse width modulator and the second pulse width modulator are each one of a comparator-type modulators or a differential amplifier.

6. The apparatus of claim 1, wherein the first logic unit comprises an XOR logic gate, wherein the XOR is configured to generate the first periodic signal by combining the first duty cycle signal and the second duty cycle signal.

7. The apparatus of claim 1, wherein a duty cycle of the first duty cycle signal is based, at least in part, on a current of a first current source and a duty cycle of the second duty cycle signal is based, at least in part, on a current of a second current source.

8. The apparatus of claim 7, wherein a duty cycle of the first phase-shifted duty cycle signal is based on the current of the first current source and a duty cycle of the second phase-shifted duty cycle signal is based on current of the second current source.

9. The apparatus of claim 1, wherein the multiplexer selectively providing the first periodic signal and the second periodic signal comprises:
selectively switching between the first periodic signal and the second periodic signal according based, at least in part, on a duty cycle, to provide a clock signal,
wherein a phase of the clock signal is adjusted by altering a portion of time during the duty cycle that is allocated to a selection of the first periodic signal and a portion of time during the duty cycle that is allocated to a selection of the second periodic signal.

10. An apparatus, comprising:
a first pulse width modulator configured to provide a first duty cycle signal having a first duty cycle;
a second pulse width modulator configured to provide a second duty cycle signal having a second duty cycle that opposes the first duty cycle; and
a logic unit configured to provide a first periodic signal based, at least in part, on the first duty cycle signal and the second duty cycle signal.

11. The apparatus of claim 10, wherein the first pulse width modulator and the second pulse width modulator comprise mismatched transistor pairs.

12. The apparatus of claim 10, further comprising:
a first state machine configured to divide the first duty cycle signal to produce a divided first duty cycle signal; and
a second state machine configured to divide the second duty cycle signal to produce a second duty cycle signal.

13. The apparatus of claim 12, wherein the logic unit is further configured to merge a rising edge of the first divided duty cycle signal with a rising edge of the second divided duty cycle signal.

14. A method, comprising:
generating a first duty cycle signal and a second duty cycle signal, wherein the second duty cycle signal is phase shifted relative to the first duty cycle signal;
adjusting the first duty cycle signal and the second duty cycle signal; and
merging the first adjusted duty cycle signal and the second adjusted duty cycle signal to provide a periodic signal.

15. The method of claim 14, further comprising:
amplifying the first duty cycle signal prior to adjusting the first duty cycle signal; and
amplifying the second duty cycle signal prior to adjusting the second duty cycle signal.

16. The method of claim 14, further comprising:
inverting the first duty cycle signal prior to adjusting the first duty cycle signal.

17. The method of claim 14, wherein adjusting the first duty cycle signal and the second duty cycle signal comprises dividing at least one of the first duty cycle signal or the second duty cycle signal by two.

18. The method of claim 14, further comprising:
receiving a first current source input and a second current source input prior to generating the first duty cycle signal and the second duty cycle signal,
wherein the first duty cycle signal is based, at least in part, on the first current source input and the second duty cycle signal is based, at least in part, on the second current source input.

19. The method of claim 14, wherein the first current source input is received from a first cascoded switchable binary weighted current source and the second current source input are is received from a second a cascoded switchable binary weighted current source.

20. The method of claim 14, further comprising:
changing a value of the first current source input, wherein changing a value of the first current source input adjusts a phase of the first duty cycle signal.

21. The method of claim 14, wherein merging the first adjusted duty cycle signal and the second adjusted duty cycle signal to provide a periodic signal comprises combining a rising edge of the first duty cycle signal with a rising edge of the second duty cycle signal.

22. A duty cycle-based phase interpolator circuit, comprising:
- a first pulse width modulator configured to generate a first duty cycle signal;
- a second pulse width modulator configured to generate a second duty cycle signal; and
- a logic unit configured to merge the first duty cycle signal and the second duty cycle signal to produce a periodic digital signal with a controllable phase depending on the first and second duty cycle signals;
- a first state machine coupled to the first pulse width modulator, wherein the first state machine is configured to perform a divide-by-two operation on the first duty cycle signal; and
- a second state machine coupled to the second pulse width modulator, wherein the second state machine is configured to perform a divide-by-two operation on the second duty cycle signal.

23. A duty cycle-based phase interpolator circuit, comprising:
- a first pulse width modulator configured to generate a first duty cycle signal;
- a second pulse width modulator configured to generate a second duty cycle signal;
- a logic unit configured to merge the first duty cycle signal and the second duty cycle signal to produce a periodic digital signal with a controllable phase depending on the first and second duty cycle signals; and
- first and second CML-to-CMOS converters coupled to the first and second pulse width modulators respectively and configured to convert respective voltages to a same magnitude.

24. A method for controlling a phase of a periodic signal, comprising:
- generating a first duty cycle signal with a first pulse width modulator and generating a second duty cycle signal with a second pulse width modulator;
- dividing the first duty cycle signal and the second duty cycle signal;
- merging the first duty cycle signal the second duty cycle signal into a periodic digital output; and
- adjusting an input to at least one of the first and second pulse width modulators to affect at least one of the first and second duty cycle signals to control the phase of the periodic digital output.

25. A method for controlling a phase of a periodic signal, comprising:
- generating a first duty cycle signal with a first pulse width modulator and generating a second duty cycle signal with a second pulse width modulator;
- merging the first duty cycle signal the second duty cycle signal into a periodic digital output;
- adjusting an input to at least one of the first and second pulse width modulators to affect at least one of the first and second duty cycle signals to control the phase of the periodic digital output; and
- wherein adjusting an input to at least one of the first and second pulse width modulators further comprises adjusting a direct current signal to modulate a triangular wave.

26. A duty cycle-based phase interpolator circuit, comprising:
- a first pulse width modulator configured to generate a first duty cycle signal;
- a second pulse width modulator configured to generate a second duty cycle signal;
- a logic unit configured to merge the first duty cycle signal and the second duty cycle signal to produce a periodic digital signal with a controllable phase depending on the first and second duty cycle signals; and
- wherein the first and second duty cycle signals are quadrature signals.

\* \* \* \* \*

UNITED STATES PATENT AND TRADEMARK OFFICE
CERTIFICATE OF CORRECTION

| | | |
|---|---|---|
| PATENT NO. | : 8,581,651 B2 | Page 1 of 1 |
| APPLICATION NO. | : 13/608690 | |
| DATED | : November 12, 2013 | |
| INVENTOR(S) | : Gideon Yong | |

It is certified that error appears in the above-identified patent and that said Letters Patent is hereby corrected as shown below:

In the Claims:

In column 7, lines 18-19, in Claim 3, delete "configured divide" and insert -- configured to divide --, therefor.

In column 7, line 23, in Claim 3, delete "configured divide" and insert -- configured to divide --, therefor.

In column 7, line 37, in Claim 4, delete "configured divide" and insert -- configured to divide --, therefor.

In column 7, line 42, in Claim 4, delete "configured divide" and insert -- configured to divide --, therefor.

In column 8, line 60, in Claim 19, delete "are is" and insert -- is --, therefor.

In column 8, line 60, in Claim 19, after "second" delete "a".

In column 10, line 8, in Claim 24, delete "signal" and insert -- signal, --, therefor.

Signed and Sealed this
Eighteenth Day of February, 2014

Michelle K. Lee
*Deputy Director of the United States Patent and Trademark Office*